(12) United States Patent  
Graeupner

(10) Patent No.: US 8,917,379 B2  
(45) Date of Patent: Dec. 23, 2014

(54) PROJECTION EXPOSURE METHODS AND SYSTEMS

(75) Inventor: Paul Graeupner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1408 days.

(21) Appl. No.: 12/483,733

(22) Filed: Jun. 12, 2009

(65) Prior Publication Data

US 2009/0280437 A1 Nov. 12, 2009

Related U.S. Application Data

(63) Continuation of application No. PCT/EP2007/001574, filed on Feb. 23, 2007.

(60) Provisional application No. 60/880,447, filed on Jan. 16, 2007.

(30) Foreign Application Priority Data

Jan. 16, 2007 (EP) ..................................... 07000731

(51) Int. Cl.  
*G03B 27/54* (2006.01)  
*G03F 7/20* (2006.01)

(52) U.S. Cl.  
CPC ........ *G03F 7/70891* (2013.01); *G03F 7/70108* (2013.01)  
USPC .......................................................... 355/67

(58) Field of Classification Search  
USPC ........................................... 355/67; 359/362  
See application file for complete search history.

(56) References Cited

U.S. PATENT DOCUMENTS

| 5,638,211 A | 6/1997 | Shiraishi |
| 6,301,001 B1 * | 10/2001 | Unno ............................ 355/67 |
| 6,452,662 B2 | 9/2002 | Mulkens et al. |

(Continued)

FOREIGN PATENT DOCUMENTS

| WO | WO 2005/026843 | 3/2005 |
| WO | WO 2005/062350 | 7/2005 |
| WO | WO 2005/078522 | 8/2005 |

OTHER PUBLICATIONS

Translation for WO 2005/062350 published Jul. 7, 2005.*

(Continued)

*Primary Examiner* — Glen Kao  
(74) *Attorney, Agent, or Firm* — Fish & Richardson P.C.

(57) ABSTRACT

Projection exposure methods, systems, sub-systems and components are disclosed. Methods can include performing a first exposure to image a first sub-pattern of the pattern, where the first sub-pattern includes a plurality of first features extending in a first direction and spaced apart essentially periodically at a predominant periodicity length P in a second direction perpendicular to the first direction. The first exposure can be performed using a multipolar illumination mode that includes at least one substantially dipolar intensity distribution having two illumination poles positioned on a pole orientation axis substantially parallel to the second direction and spaced apart from each other. The poles of the dipolar intensity distribution can each have an azimuthal width defined by a pole angle θ, and a pole area $A_{POLE}$ according to: $0.6 < A_{POLE}/A_{OPT} < 1.1$, where $A_{OPT}$ is a pole area according to: $A_{OPT} = \theta - \sin(\theta)$, with $\cos(\theta/2) = \lambda/(2 \cdot P \cdot NA)$, where λ is a nominal operation wavelength of radiation used for the first exposure and NA is an image-side numerical aperture of a projection optical system used for the first exposure.

24 Claims, 11 Drawing Sheets

(56) References Cited

U.S. PATENT DOCUMENTS

| | | | |
|---|---|---|---|
| 6,855,486 B1 | 2/2005 | Finders et al. | |
| 2001/0001247 A1* | 5/2001 | Finders et al. | 355/53 |
| 2002/0166107 A1 | 11/2002 | Capodieci et al. | |
| 2004/0022068 A1* | 2/2004 | Shiozawa | 362/553 |
| 2004/0095573 A1* | 5/2004 | Tsai et al. | 356/237.5 |
| 2006/0078806 A1 | 4/2006 | Hansen | |
| 2006/0126049 A1* | 6/2006 | Deguenther et al. | 355/69 |
| 2006/0244941 A1* | 11/2006 | Gruner et al. | 355/69 |

OTHER PUBLICATIONS

Human translation for WO 2005/062350 published Jul. 7, 2005.*

D.G. Flagello et al., "Optimizing and enhancing optical systems to meet the low k1 challenge," Proceedings of the SPIE, Bellingham, VA, vol. 5040, No. 1, Jun. 2003, pp. 139-150.

The International Preliminary Report on Patentability for the corresponding PCT Application No. PCT/EP2007/001574, with a mailing date of Jul. 30, 2009.

* cited by examiner

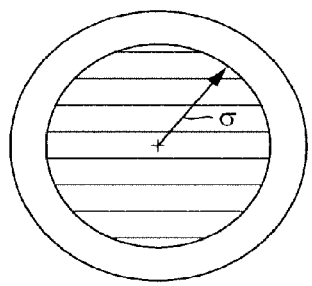
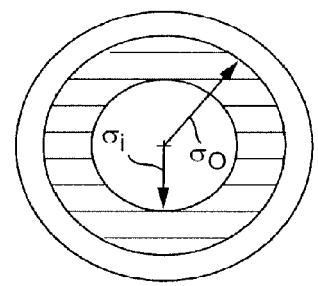
Fig. 2A             Fig. 2B
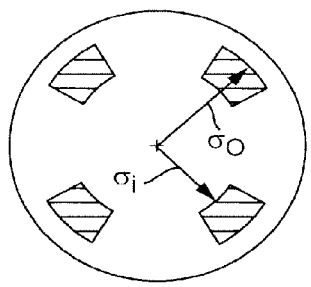
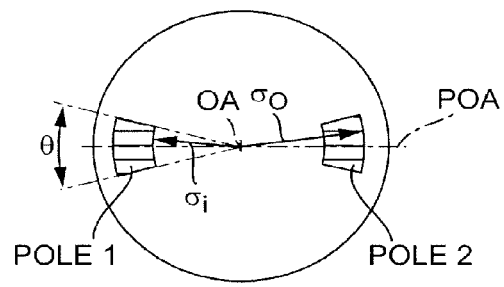
Fig. 2C             Fig. 2D
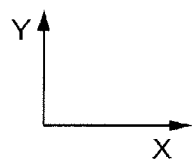

PROJECTION EXPOSURE METHODS AND SYSTEMS

CROSS-REFERENCE TO RELATED APPLICATIONS

This application is a continuation of, and claims benefit under 35 USC 120 to, international application PCT/EP2007/001574, filed Feb. 23, 2007, which claims benefit of European Application No. 07000731.5, filed Jan. 16, 2007 and U.S. Ser. No. 60/880,447, filed Jan. 16, 2007. International application PCT/EP2007/001574 is hereby incorporated by reference in its entirety.

FIELD

The disclosure relates to projection exposure methods, systems, sub-systems and components.

BACKGROUND

Microlithographic projection exposure methods are used for fabricating semiconductor components and other finely structured components. Use is made of masks (reticles) that bear the pattern of a structure to be imaged, for example a line pattern of a layer of a semiconductor component, such as an integrated circuit (IC). A mask is positioned in a projection exposure system between an illumination system and projection objective in the region of the object surface of the projection objective, and illuminated with illumination radiation provided by the illumination system. The radiation varied by the mask and the pattern forms projection radiation propagating through the projection objective, which images the pattern of the mask onto the substrate to be exposed, which normally bears a radiation-sensitive layer (photoresist). In some cases, the pattern of the mask is illuminated with radiation from an effective source having an intensity distribution at a pupil plane of the illumination system corresponding to a particular illumination mode. An image of the illuminated mask is projected onto a resist-coated semiconductor wafer.

SUMMARY

In some embodiments, the disclosure provides projection exposure methods and systems that can provide improved long-term stability of optical performance when multipole illumination, such as dipole illumination, is used.

In certain embodiments, the disclosure provides projection exposure methods and systems that can allow imaging of patterns having predominant periodic features running in a first direction at high contrast, while at the same time other sub-patterns including features running at an angle to the first direction may still be imaged with sufficient detail.

In one aspect, the disclosure generally provides a method of imaging a pattern onto a substrate provided with a layer of a radiation-sensitive material. The method includes performing an exposure to image a first sub-pattern of the pattern, where the first sub-pattern includes a plurality of first features extending in a first direction and spaced apart essentially periodically at a predominant periodicity length P in a second direction perpendicular to the first direction. The exposure is performed using a multipolar illumination mode that includes at least one substantially dipolar intensity distribution having two illumination poles positioned on a pole orientation axis substantially parallel to the second direction and spaced apart from each other. The poles of the dipolar intensity distribution each have an azimuthal width defined by a pole angle θ, and a pole area $A_{POLE}$ according to:

$$0.6 < A_{POLE}/A_{OPT} < 1.1$$

where $A_{OPT} = \theta - \sin(\theta)$
and where $\cos(\theta/2) = \lambda/(2 \cdot P \cdot NA)$, where θ is a nominal operation wavelength of radiation used for the first exposure and NA is an image-side numerical aperture of a projection optical system used for the first exposure.

The spatial intensity distribution at a pupil plane of the illumination system representing the effective source of radiation incident on the mask pattern can be optimized considering at least two different criteria. A first criterion relates to the angles of incidence (or illumination directions) provided by the effective source in view of the particular sub-pattern to be exposed, which is characterized by first features extending in a first direction and spaced apart essentially periodically at the predominant periodicity length P in the second direction. Under these conditions, an optimized illumination (optimized for contrast in an appropriate focus range determined by the depth of focus (DOF)) would generally provide only those illumination directions which could contribute to the imaging process for the detail of interest, which is characterized by periodicity length P. Where two-beam interference beyond the coherent resolution limit is desired to optimize resolution, the illumination directions allowing high contrast two-beam interference correspond to certain areas in the pupil of the illumination system. Those areas including all useful illumination directions (to obtain maximum contrast) generally define areas in the pupil surface having a lenticular shape resulting from an overlapping zone of two circles with equal unit radius having a distance d between the centers of the circles. Illumination directions corresponding to pupil locations outside these useful lens-shaped areas generally do not contribute to the desired two-beam interference and might in fact blur a resulting image.

Those lenticular useful areas including all illumination directions contributing constructively to two-beam interference may be characterized by their size and correspond to a pole area (e.g., an optimum pole area) $A_{OPT}$ in a conjugated exit pupil of the projection optical system used for the exposure method.

The second criterion regards the illumination angles actually used in an exposure process. It has been found that known systems employing dipole illumination typically use only a small fraction of the illumination angles which might theoretically be used to form a high-contrast image with two-beam interference. For example, small poles with circular shape or poles having the shape of a segment of an annulus have been used. Whereas those small poles of dipole illumination may be acceptable from a contrast point of view if only "useful" illumination directions are used, drawbacks in respect to overall performance may result if light energy is concentrated on correspondingly small areas on optical surfaces at or close to a pupil surface within the exposure system. Those local energy concentrations may cause or contribute to "lens heating" and associated time-dependent fluctuations of performance of the exposure system.

Such issues can be addressed and at least partly avoided by providing illumination modes including at least one substantially dipolar intensity distribution with poles having optimized pole size and pole shape such that the pole area of such poles and/or the shape of the poles is close to the pole area and/or the pole shape. Where the condition $0.6 < A_{POLE}/A_{OPT} < 1.1$ is fulfilled for a pole area, light energy within a pupil surface may be distributed over relatively large area fractions of the pupil essentially without trade-off between attainable contrast and intensity. Distributing light energy over larger local areas instead of smaller local areas has been found to significantly reduce detrimental effects of lens heating and associated effects on the performance. Where the pole area becomes significantly smaller than the lower limit a concentration of radiation energy in a relatively small area may result, which may cause problems associated with inhomogenous lens heating. Where the pole area becomes significantly larger than the upper limit, a corresponding distribution of illumination directions may include larger fractions of illumination direction not constructively contributing to a desired contrast, which may be undesirable.

In some embodiments, the poles of the dipolar intensity distribution have a generally biconvex shape with a pole dimension ratio PDR=PH/PW>1 between a pole height PH and a pole width PW, where the pole width PW is measured between an inner and an outer pole edge in a direction parallel to the pole orientation axis and the pole height PH is measured between pole edges in a direction perpendicular to the pole orientation axis. At least one of the conditions PDR>1.2, PDR>1.4, PDR>1.6, PDR>1.8, PDR>2.0, PDR>3.0 and PDR>3.5 may be fulfilled. For example, a generally biconvex shape may be defined by a convex polygon having four or more sides, at least some of the sides including angles significantly larger than 90°, for example 120° or more.

In certain embodiments, the poles of the dipolar intensity distribution have a substantially lenticular pole shape. The shape of a "planar circular two-angle" may be well approximated by a lenticular pole shape. A planar circular two-angle may be bound by two segments of a circle with opposite sense of curvature, where the segments intersect at intersection points forming the two "corners" of a "two-angle". The segments of the circle delimiting the pole shape may have the same radius of curvature.

In some embodiments, the poles of the dipolar intensity distribution have a parallelogram pole shape. A pole defined by two pairs of mutually parallel sides including non-rectangular angles may be optimized to fit closely to the shape of a pole area. The pole shape may be the shape of a rhombus (or rhomb), which is a quadrilateral in which all of the sides are of equal length (equilateral quadrangle). The shape may be described as a diamond or lozenge.

In certain embodiments, the poles of the dipolar intensity distribution each have a pole dimension ratio PDR=PH/PW between a pole height PH and a pole width PW according to $$PDR_{OPT}-20\% \leq PDR \leq PDR_{OPT}+20\%$$

where $PDR_{OPT}=\sin(\alpha)/(2*(1-\cos(\alpha)))$ and where the pole width PW is measured between an inner and an outer pole edge in a direction parallel to the pole orientation axis and the pole height PH is measured between pole edges in a direction perpendicular to the pole orientation axis. If this condition is fulfilled, a desirable balance may be obtained between a high contrast and a relatively large area where incident radiation energy is distributed at optical elements relatively close to a pupil surface.

The disclosure also relates to an illumination system configured to generate and use the large pole illumination settings described above, and to a projection exposure apparatus including such an illumination system.

In some embodiments, the disclosure provides an illumination system that includes a plurality of optical elements constructed and arranged to receive primary radiation emitted from a primary light source and to generate illumination radiation incident on a mask bearing a pattern. A number of the optical elements form a pupil shaping unit configured to generate a defined spatial intensity distribution corresponding to a selected illumination mode in a pupil surface of the illumination system. The spatial intensity distribution being a multipolar intensity distribution includes at least one substantially dipolar intensity distribution having two illumination poles positioned on a pole orientation axis and spaced apart from each other. The poles of the dipolar intensity distribution each have a pole shape selected from: a generally biconvex pole shape with a pole dimension ratio PDR=PH/PW>1 between a pole height PH and a pole width PW, where the pole width PW is measured between an inner and an outer pole edge in a direction parallel to the pole orientation axis and the pole height PH is measured between pole edges in a direction perpendicular to the pole orientation axis; a generally biconvex pole shape defined by a convex polygon having four or more sides, where some of the sides include angles larger than 90°; a parallelogram pole shape defined by a non-rectangular parallelogram having a shorter diagonal and a longer diagonal, where the shorter diagonal extends substantially parallel to a line parallel to the pole orientation axis; and a substantially lenticular pole shape defined by two convexly curved edges having opposite sense of curvature and centres of curvature essentially on a line parallel to the pole orientation axis.

While reference is made to the use of the projection exposure method and apparatus in the manufacture of integrated circuits, more generally the method and apparatus may also be used in other applications, such as in the manufacture of integrated optical systems, guidance and detection patterns for magnetic domain memories, liquid-crystal display panels, thin-film magnetic heads, etc.

The individual features may be implemented either alone or in combination as embodiments, or may be implemented in other fields of application. Further, they may represent advantageous embodiments that are protectable in their own right, for which protection is claimed in the application as filed or for which protection will be claimed during pendency of the application.

BRIEF DESCRIPTION OF THE DRAWINGS

FIG. 2 shows schematically various illumination modes;

DETAILED DESCRIPTION

In the following description, similar or identical features shown in different figures are designated with the same reference identifications, where appropriate.

In optical lithography it is known to use off-axis illumination, which enables smaller features to be faithfully imaged. With this technique, a mask providing the patterned structure (pattern) is illuminated at oblique (non-perpendicular) angles such that process latitude is improved by increasing the depth of focus and/or such that contrast is improved.

Figure 1:
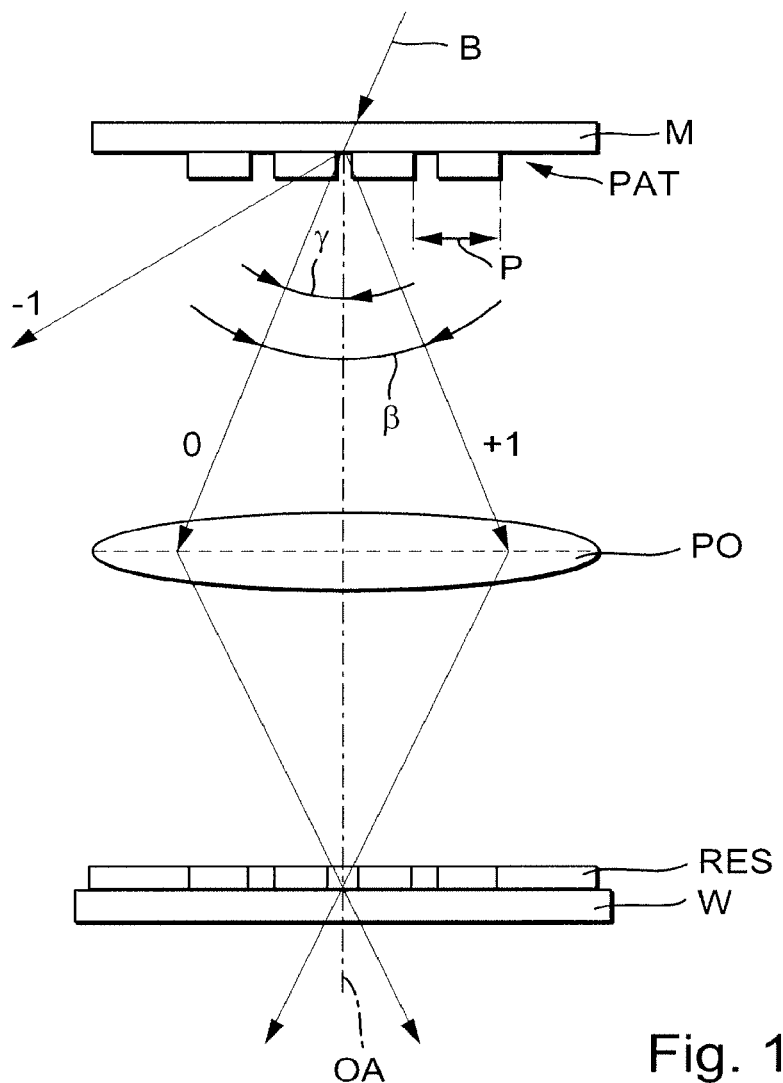
FIG. 1 illustrates schematically the principle of symmetric off-axis illumination.

FIG. 1 illustrates this principle in which a beam B of radiation is incident on a mask M carrying a pattern PAT at an opening angle γ inclined to the optical axis OA, which is conventionally vertical. The incident beam B is diffracted by features of the pattern PAT on the mask M, which are to be imaged onto the wafer W coated by a layer of photoresist RES. The zeroth and two first-order-diffracted beams (0,±1) are shown in FIG. 1. Improved performance can be achieved when, for example, at least part of the zeroth order and one of the first orders, which are coherent, are captured by the projection objective PO and used to form the image on the wafer W.

The smaller the pitch P (or periodicity length) of features of the pattern on the mask M, the larger the diffraction angle β will be according to $\beta = \lambda/P$, where λ is the nominal operating wavelength of radiation in beam B. If the size of the features decreases and/or their density increases too much, there will come a point at which the pupil of the projection objective PO can no longer capture more than one diffracted order. In practical systems there will be a range of opening angles γ which determines the partial coherence of the light source and thus is important to the figures of merit of the exposure process, such as exposure latitude, depth of focus and proximity effects.

The distribution of opening angles γ can be visualized by considering the intensity distribution of the effective radiation source (effective source) or equivalently the intensity distribution in the plane of a pupil of the projection objective. FIG. 2 shows representative examples.

FIG. 2A illustrates a simple on-axis illumination mode characterized by the parameter a shown by an arrow in the figure. Values of a (often referred to as coherence factor) are conventionally quoted as the ratio of the radius of the illumination intensity disc (hatched) to the radius of the pupil and therefore take a value between 0 and 1.

FIG. 2B shows an annular illumination mode in which the intensity distribution of the source is confined to an annulus to limit the range of angles of incidence of the off-axis illumination, considering that the spatial intensity distribution at the pupil plane is related to the angular distribution at the mask plane, which is a Fourier transform plane to the pupil plane. The annulus may be characterized by the values $\sigma_i$ and $\sigma_o$, which are the ratios of its inner and outer radii to the radius of the pupil.

FIG. 2C illustrates the intensity distribution of the quadrupole illumination mode, the use of which sometimes gives improved imaging results to the use of annular or coherent modes. Conventionally, in using such a quadrupole configuration, it is assumed that the patterned structure of the mask to be projected includes sub-patterns of orthogonal lines along x and y axes and the illumination is oriented such that each of the four poles is situated in a respective one of the four quadrants defined by these x and y axes and at their point of intersection.

In specific applications it has been found that superior performance can be obtained using dipolar illumination modes. FIG. 2D shows an example of the dipolar illumination intensity distribution for a dipole mode. The two poles POLE1, POLE2 of this mode are located off the optical axis OA of the imaging system. For illustrative purposes, the two poles illustrated in FIG. 2D are said to lie along the x axis (second direction) and may be optimal for imaging lines extending parallel to the y axis (first direction), i.e. perpendicular to the pole orientation axis POA joining the two poles. Sometimes the x and y axis are referred to as horizontal and vertical, respectively, but these terms typically do not bear any relation to the orientation of the machine.

As illustrated in FIG. 2D the pole shape of the poles POLE1, POLE2 in conventional systems may correspond to an azimuthal section of an annulus. Due to the desire that the first diffraction order should pass completely through the aperture of the projection objective to obtain maximum contrast, limitations result for the radial width $\Delta\sigma = \sigma_o - \sigma_i$ of the poles and for the azimuthal width (width in circumferential direction) of the poles defined by the pole angle Θ.

Figure 3:
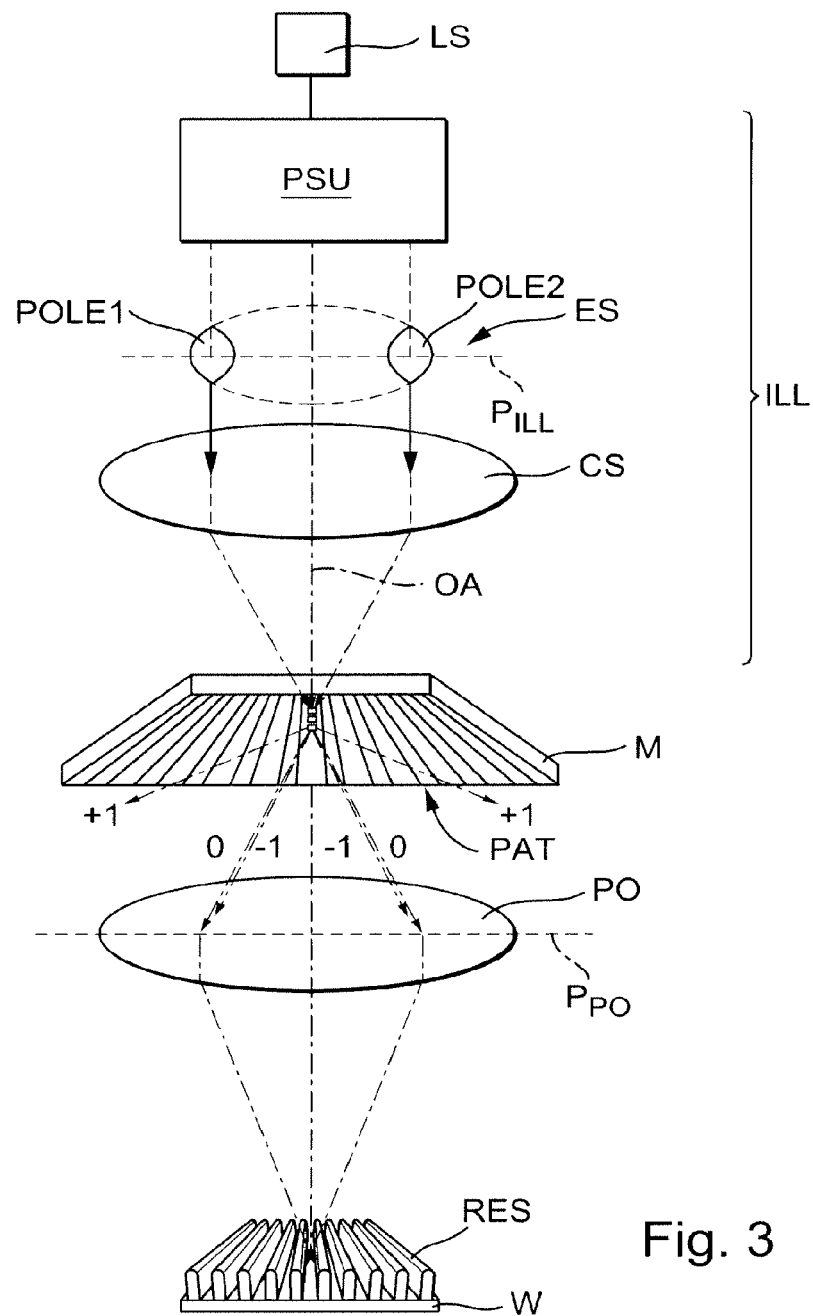
FIG. 3 illustrates schematically a projection exposure system configured for dipole illumination mode with lenticular poles.

With dipole illumination, the effective light source is confined to two poles, in order to create the conditions for two-beam imaging with theoretical ideal contrast. FIG. 3 illustrates schematically a projection exposure system configured for dipole illumination mode. Primary radiation provided by a primary light source LS is transformed by an illumination system ILL to provide illumination radiation incident on a mask M bearing a pattern PAT. The radiation is diffracted by pattern PAT and forms projection radiation propagating through the projection objective PO, which images the pattern of the mask onto the substrate, which is a wafer W coated with a resist layer RES in the exemplary embodiment. The illumination system ILL includes a pupil shaping unit PSU to create an effective source ES formed by a predefined intensity distribution at a pupil plane $P_{ILL}$ of the illumination system, where the predefined intensity distribution is a dipole illumination characterized by two lenticular poles POLE1 and POLE2. The pupil plane $P_{ILL}$, where the effective source ES is formed, is a Fourier transform surface with respect to the object surface of the projection objective PO, where the mask M is situated. Therefore, the spatial distribution of light intensity of the effective source ES determines an angular distribution of illumination radiation incident on the mask M. A condenser system CS is provided to perform the Fourier transformation.

The pupil surface $P_{PO}$ of the projection objective is optically conjugated to the pupil surface $P_{ILL}$ of the illumination system. Therefore, in the absence of a mask, a spatial intensity distribution equivalent to the intensity distribution at the effective source ES may be formed in the pupil surface $P_{PO}$ of the projection objective. Where a mask bearing a pattern is inserted between the illumination system and the projection objective, the intensity distribution in the pupil plane $P_{PO}$ of the projection objective also contains diffraction information corresponding to the properties of the mask pattern PAT.

Figure 4:
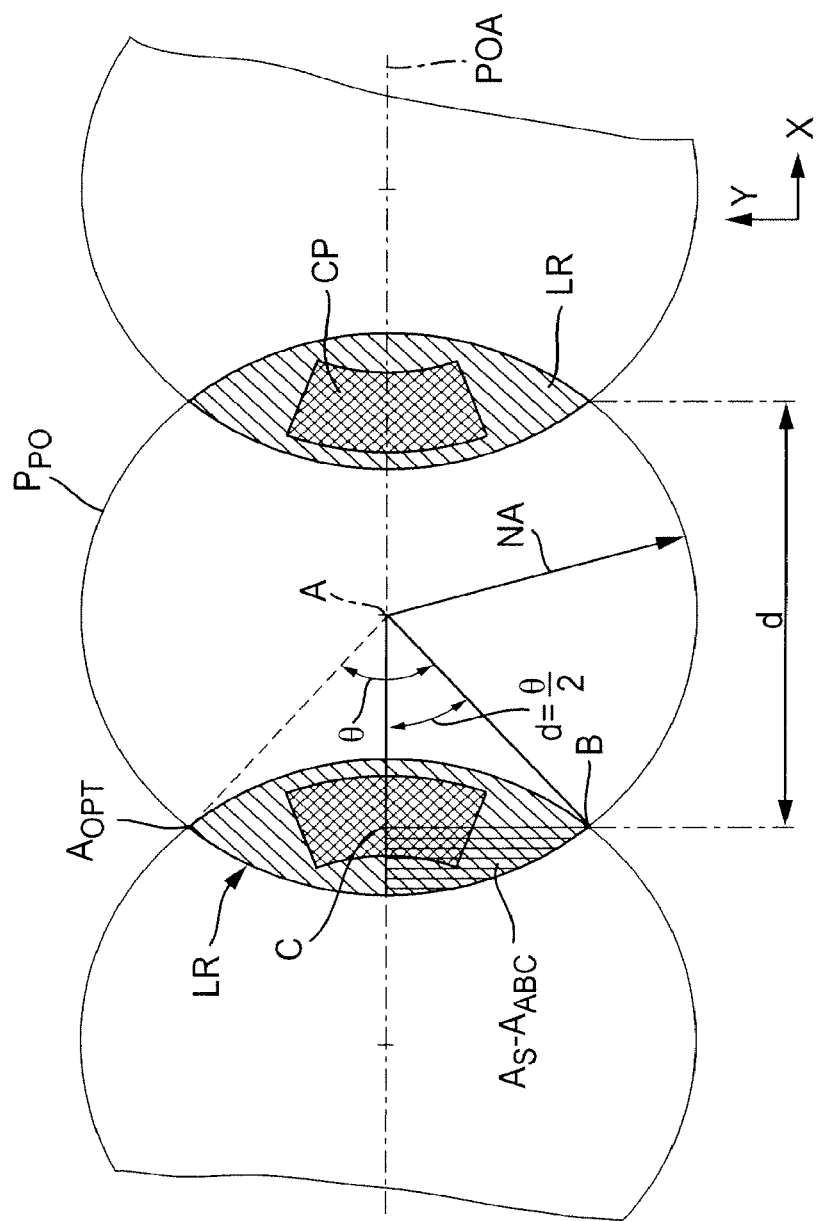
FIG. 4 illustrates schematically a circular pupil of a projection objective at imaging conditions beyond the coherent resolution limit using symmetric two-beam interference imaging conditions.

FIG. 4 illustrates schematically a circular pupil $P_{PO}$ of a projection objective having unit radius (length=1) corresponding to the utilized image-side numerical aperture NA at imaging conditions beyond the coherent resolution limit of a periodic pattern of mutually parallel lines running in a first direction (y direction) having periodicity length (pitch) P in a second direction (x direction). A symmetric two-beam interference imaging condition is assumed, where a first diffraction order (+1 or −1) coincides with the zeroth order (0). In this representation, all illumination directions which contribute constructively to two-beam interference correspond to pupil positions lying within the lenticular (lens-shaped) regions LR at opposite edges of the pupil in the x direction. Those lenticular regions (also denoted as "planar circular two-angles") result from a partial overlap of circles of equal size corresponding to neighbouring diffraction orders. A distance d between the centers of the lenticular regions is determined by $$d = \lambda/(P*NA).$$

The angular width of the lenticular area (width in circumferential direction) may be defined by a pole angle θ between the opposing corners of the area in the y direction, where pole angle θ is twice the pole half angle α (i.e. θ=2*α). The size of the lenticular area, i.e. the area $A_{OPT}$ of the hatched lenticular region LR in FIG. 4, may be calculated as $$A_{OPT} = \theta - \sin(\theta)$$

with $$\cos(\alpha) = d/2 = \lambda/(2*P*NA).$$

It is contemplated that a maximum contrast is possible if all illumination directions corresponding to pupil positions within the lenticular regions LR are used.

The size $A_{OPT}$ of the lenticular regions may be calculated based on the following considerations explained now in connection with FIG. 4. The area $A_{OPT}$ is four times the difference between the area $A_S$ of the circular sector with sector angle α, and the area $A_{ABC}$ of triangle ABC indicated in FIG. 4. The difference area $A_S - A_{ABC}$ is hatched darkly in FIG. 4. Calculating the angles in radians, the sector area $A_S$ is calculated as follows: $A_S = (\alpha/2\pi) \cdot \pi \cdot r^2$, where r=1 is the unit radius of the pupil. Therefore, $A_S = (\alpha/2\pi) \cdot \pi = \alpha 2$. With distance A−C=cos(α) and distance B−C=sin(α) the area $A_{ABC}$ of the triangle calculates as: $A_{ABC} = (\sin(\alpha) \cdot \cos(\alpha))/2$. Further considering that $2 \cdot \sin(\alpha) \cdot \cos(\alpha) = \sin(2 \cdot \alpha)$, the area $A_{OPT}$ of the lenticular region LR calculates as follows:

$$\begin{aligned} A_{OPT} &= 4 \cdot (A_s - A_{ABC}) \\ &= 4 \cdot (\alpha/2 - (\sin(\alpha) \cdot \cos(\alpha))/2) \\ &= 2 \cdot \alpha - \sin(2 \cdot \alpha) \\ &= \theta - \sin(\theta) \end{aligned}$$

Figure 5A:
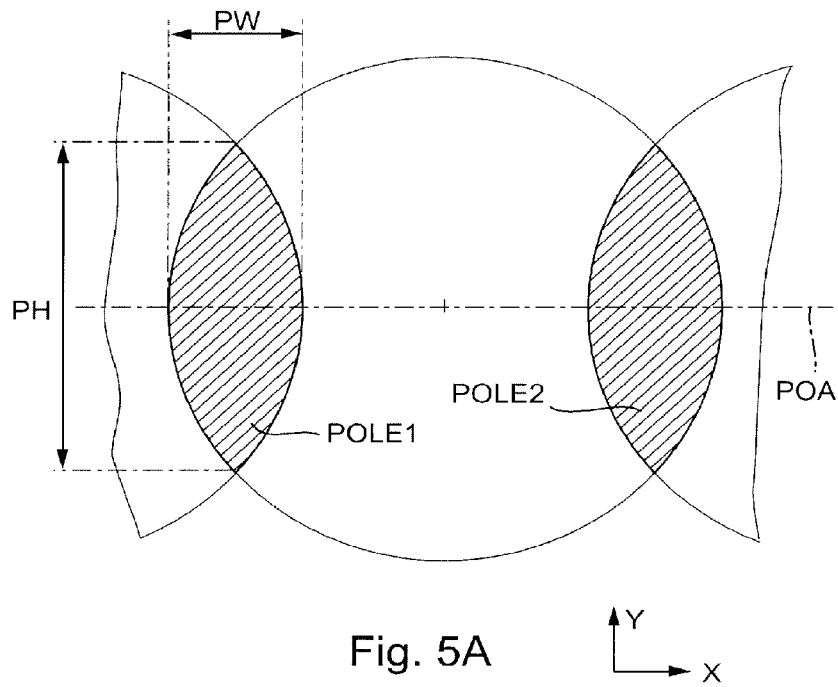
FIG. 5 illustrates where the poles of the dipolar intensity distribution each have a lenticular pole shape.

An illumination pole having the size and shape of a desirable (e.g., optimum) lenticular region LR may be characterized by a pole width PW measured between an inner and an outer pole edge in a direction parallel to the pole orientation axis POA, and a pole height PH measured between pole edges in a direction perpendicular to the pole orientation axis, i.e. in y direction (see FIG. 5A). Defining a pole dimension ratio PDR as the aspect ratio between pole PH height and pole width PW according to PDR=PH/PW, for the lenticular regions $PDR_{OPT} = \sin(\alpha)/(1-\cos(\alpha))$.

In conventional systems, only a fraction of those illumination directions is normally used. For illustration purposes, FIG. 4 shows conventional poles CP having a shape corresponding to an azimuthal section of an annulus within the lenticular regions LR. Limitations regarding radial width Δσ and pole angle result from the desire that the first diffraction order should fall completely within the aperture of the objective to obtain maximum contrast. As evident from FIG. 4, the area of the conventional poles CP is significantly smaller than the area $A_{OPT}$ of the lenticular zones which could be used for the imaging process at good (e.g., optimum) contrast. For example, the size of the conventional poles may be 50% or less of the area $A_{OPT}$.

The pole dimension ratio PDR of a conventional pole usually differs significantly from the pole dimension ratio $PDR_{OPT}$ defined above. For example, a circular pole would correspond to PDR=1. The annular segment shaped conventional poles CP depicted schematically in FIG. 4 may have varying pole dimension ratio depending on the selected values for Δσ and pole angle. Generally, as the pole height increases, the pole width will decrease, and vice versa.

Now consider a lens or another optical element having an optical surface at or close to the pupil surface of the projection objective, where light intensity is concentrated at the edge of the lens surface in regions corresponding to the poles of the dipole illumination. Studies have shown that effects of lens heating may cause characteristic deformations of wavefronts passing the projection objective due to local deformation of the lenses and/or due to localized radiation-induced changes of refractive index. For example, where a dipolar intensity distribution is used, the local deformation of lenses or other optical elements and associated wavefront deformations may be dominated by astigmatic contributions.

In the following a number of embodiments are described where a multipolar illumination mode includes at least one substantially dipolar intensity distribution having two illumination poles, where the pole area $A_{POLE}$ of poles is selected to be very close to or equal to the pole area $A_{OPT}$ defined above. Negative effects caused by localized lens heating may be reduced significantly when compared to using conventional poles.

Figures 5B, 5C:
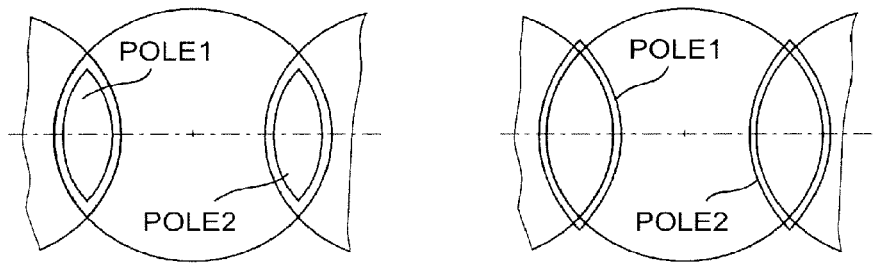

FIG. 5 illustrates where the poles POLE 1 and POLE 2 of the dipolar intensity distribution each have a lenticular pole shape defined by two convexly curved edges having opposite sense of curvature and centers of curvature essentially on a line parallel to the pole orientation axis POA. In FIG. 5A the size and shape of the poles is adjusted such that the poles exactly fit the lenticular region LR corresponding to the given pitch P of the sub-pattern to be printed. The conditions $A_{POLE} = A_{OPT}$ and $PDR_{POLE} = PDR_{OPT}$ hold for the pole area and pole dimension ratio, respectively. FIG. 5B shows an example where all light intensity is concentrated in poles POLE1, POLE2 slightly smaller than the lenticular area by about 10%. Although not all illumination directions theoretically contributing to constructive interference are used in this setting, the intensity of the poles is still distributed over a relatively large area on optical surfaces near pupil surfaces to eliminate or alleviate lens heating problems. In FIG. 5C the size of the poles POLE1, POLE2 is slightly larger than the pole area $A_{OPT}$ of poles such that a small fraction of illumination directions falls outside the pupil, thereby not contributing to imaging, and some illumination angles smaller than the lowest limit of the optimum angular distribution according to FIG. 4 are also present. As light energy is distributed over relatively large areas around the poles, lens heating problems may be smallest in FIG. 5C with potential trade-offs in attainable contrast. Optimum compromise settings may be evaluated by simulation or test exposures.

FIG. 6 illustrates schematically one option to generate biconvex, lenticular (lens-shaped shaped) illumination poles as described above in a modified conventional illumination system configured to generate illumination poles having the shape of a segment of an annulus. Illumination systems as described e.g. in U.S. Pat. No. 6,452,662 B2 may be used and modified for that purpose. The disclosure of U.S. Pat. No. 6,452,662 B2 and U.S. Pat. No. 6,855,486 B1 regarding constructive details of illumination systems capable of generating segment shaped pairs of poles are incorporated herein by reference.

Figure 6A:
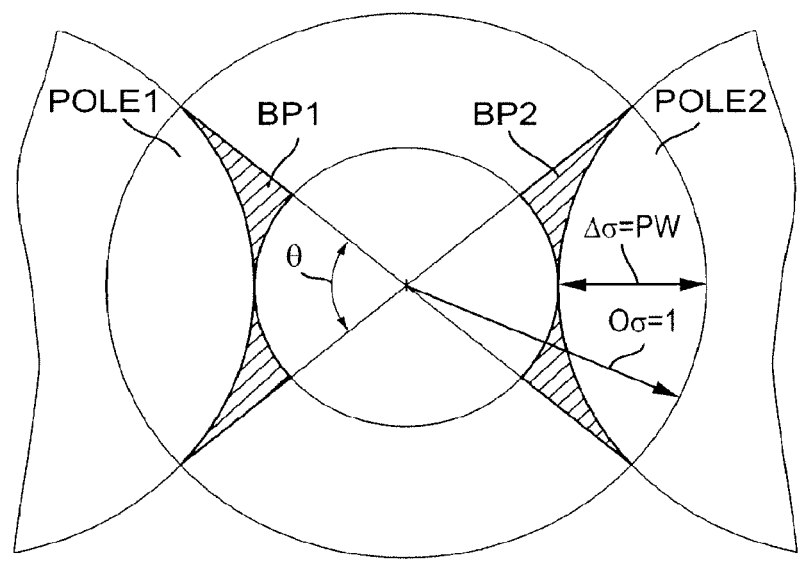
FIG. 6 illustrates schematically the use of a mask to generate biconvex, lenticular illumination poles in a modified conventional illumination system.
Figure 6B:
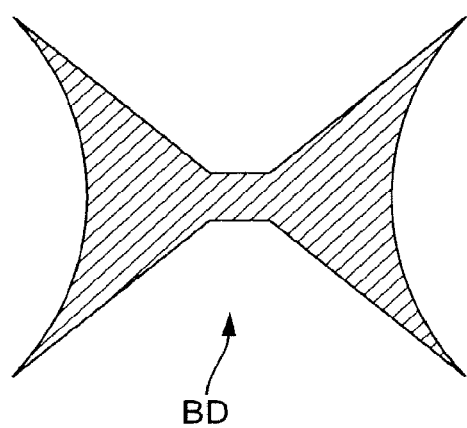

The adjustable optical elements of the pupil shaping unit of the illumination system are first set to generate, in a pupil surface of the illumination system, a dipolar intensity distribution having two basic poles BP1 and BP2, each having the shape of a segment of an annulus where the outer radius is set to $\sigma_O=1$ and the width of the annular segment is adjusted such that $\Delta\sigma$ corresponds to the desired pole width PW of the desired lenticular pole. The pole angle $\theta$ is set to correspond to the desired pole angle $\theta$ of the lenticular pole (FIG. 6A).

It is to be noted that conventional systems may need to be modified with respect to the variation width of adjustable elements to allow for those dimensions of the annular segment shaped poles, which may be larger than poles in the conventional system in both the circumferential and the radial direction.

The illumination system includes a blocking device BD (FIG. 6B) at or close to the pupil surface of the illumination system where the effective source is generated, or at or close to a pupil surface optically conjugate thereto. The blocking device in this embodiment is designed to block those areas at the inner edge of the annulus segment shaped poles which lie outside the lenticular region desired for the pole shape. For that purpose, the blocking device may take the general butterfly shape schematically shown in FIG. 6B having "wings" extending in azimuthal direction over an angle $\theta$ corresponding to the pole angle, and comprising outer edges concavely curved inwards towards the center of the blocking device to define the inner edge of the lenticular pole. Those areas actually blocked by the blocking device are drawn with diagonal hatching in FIG. 6A. When the blocking device is inserted into the appropriate position, the resulting effective light source includes two lenticular poles POLE1 and POLE2 having the pole area $A_{OPT}$ or a slight variation therefrom as described above.

An exchanging device allowing to exchange blocking devices having different layout may be provided to allow variation of dimensions of the lenticular poles. Also, a blocking device may be designed to be variable, for example by providing a number of smaller blades arranged in the manner of a fan to allow varying the pole angle $\theta$ as desired. The blocking device may also be formed by an opaque coating on a transparent optical element, such as a plate, which may be exchangeable.

Figure 7A:
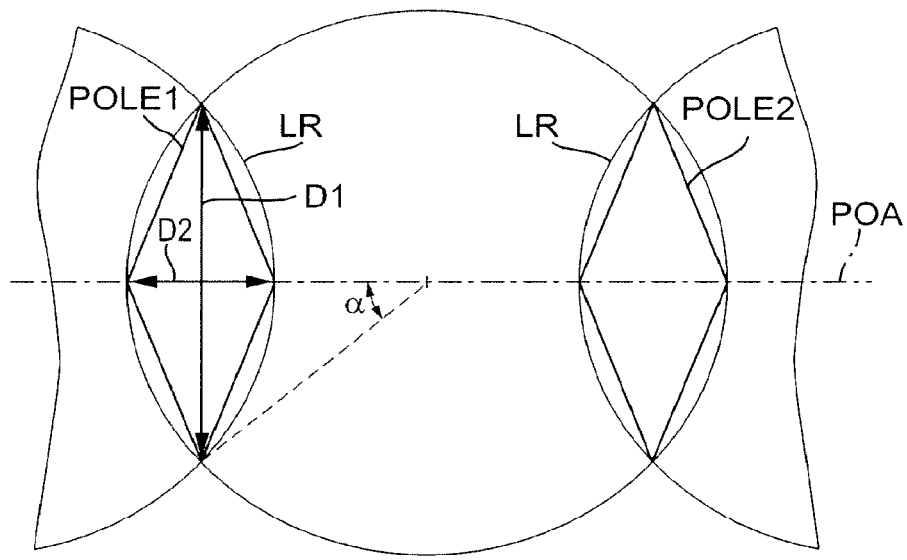
FIG. 7 shows poles of a dipolar intensity distribution having a parallelogram pole shape.
Figure 7B:
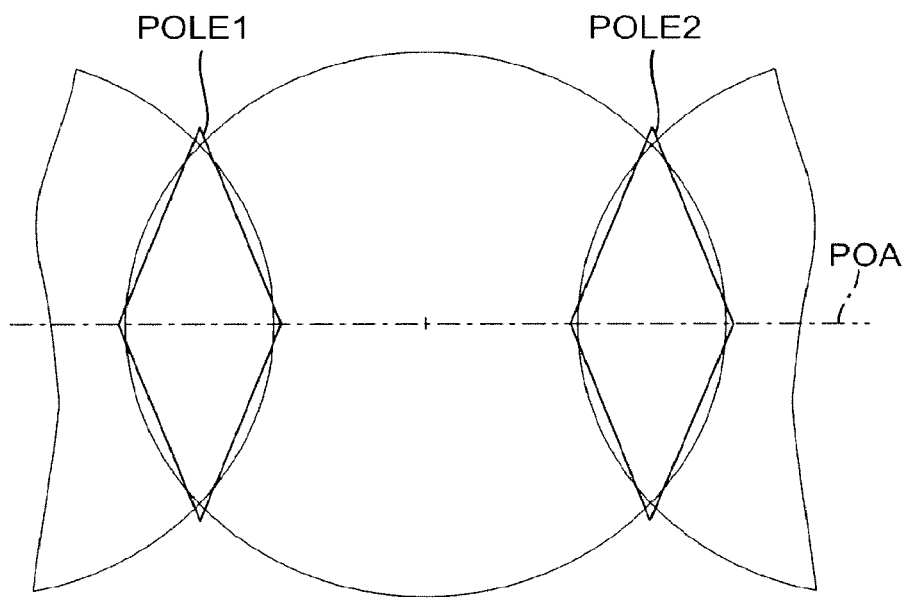

In FIG. 7 the poles of the dipolar intensity distribution have a parallelogram pole shape defined by a non-rectangular parallelogram having a shorter diagonal D2 and a longer diagonal D1, the shorter diagonal extending substantially parallel to a line parallel to the pole orientation axis POA. FIGS. 7A and 7B each show the lenticular regions LR corresponding to the optimum size and shape of poles adapted to a sub-pattern having predominant pitch P. In FIG. 7A, each of the poles POLE1 and POLE2 of the dipolar intensity distribution has the shape of a rhombus, i.e. the shape of an equilateral quadrangle arranged mirror symmetric to the pole orientation axis POA. The biconvex, diamond shaped poles are fit into the optimum sized lenticular region LR such that their longer diagonal D1 (extending in y-direction) defines the pole height PH, whereas the shorter diagonal D2 extending between the inner and outer edge of the pole in the second direction (x-direction) corresponds to the pole width PW. The area of each of the rhombohedral poles POLE1, POLE2 is $A_{POLE}=(D1*D2)/2$, which is smaller than the area $A_{OPT}$ of the optimum sized lenticular region. The difference in area, $\Delta A$, may be calculated according to $\Delta A=2*\alpha-\sin(2*\alpha)-4*\sin(\alpha)*(1-\cos(\alpha))$.

As exemplified in FIG. 7B, it is not necessary to fit the diamond shaped poles exactly into the optimum lenticular region LR. For example, the rhombohedral poles may be slightly larger such that tips of the rhombohedron in the first direction and/or in the second direction may extend beyond the outer limits of the ideal lenticular region LR. Also, the pole dimension ration PH/PW may deviate from the optimum value, thereby resulting in slightly narrower or wider diamond shaped poles. The deviation may be up to about 10%, for example. Although some loss of contrast might occur, the oversizing of the rhombohedral poles allows to distribute light energy over larger areas at the edges of optical elements near to a pupil, thereby eliminating or decreasing problems associated with localized lens heating.

Figure 8:
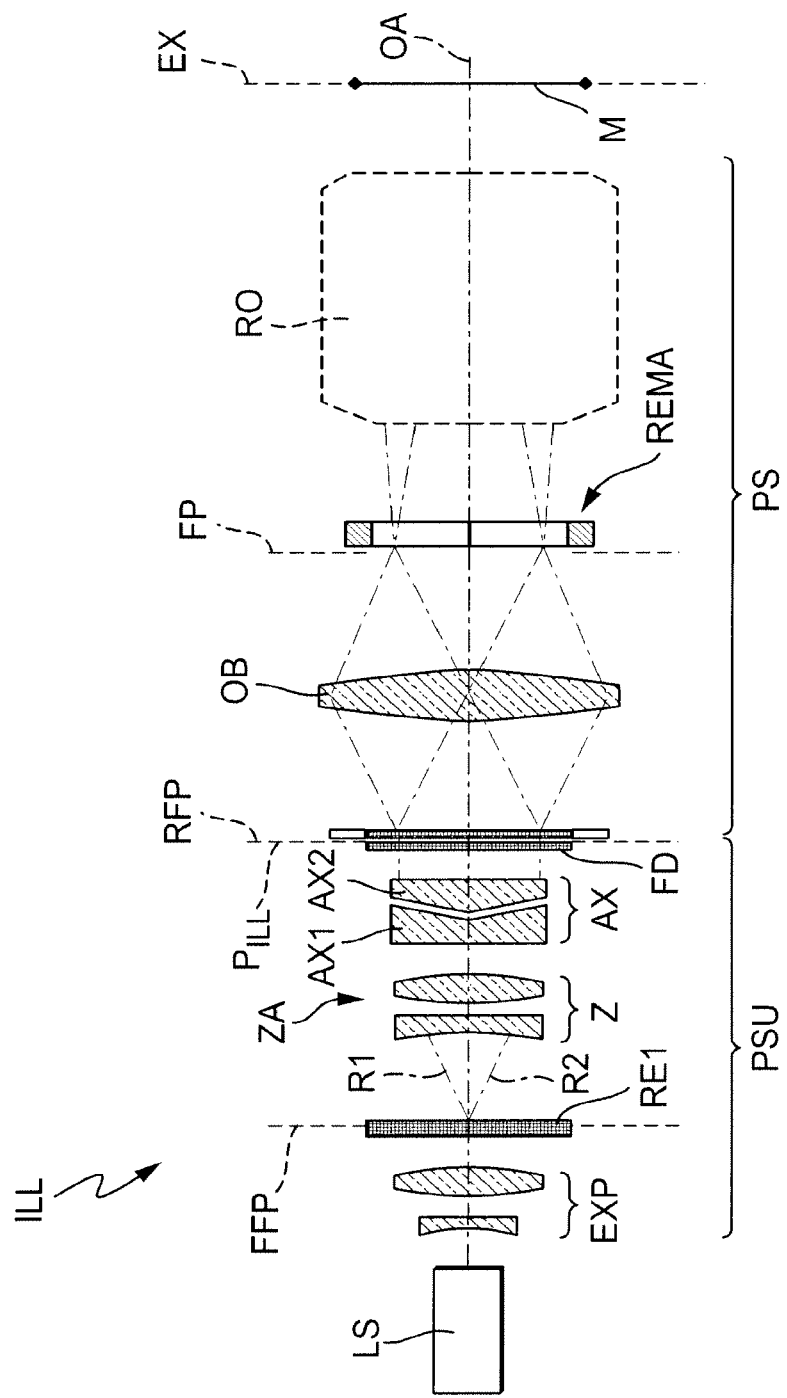
FIG. 8 shows a meridional section of an illumination system configured to generate large polses in a projection exposure step-and-scan apparatus.

FIG. 8 shows a meridional section of an illumination system ILL configured to be used in a projection exposure step-and-scan apparatus. The illumination system includes a plurality of optical elements constructed and arranged to receive primary radiation emitted from a primary light source LS and to generate illumination radiation incident on a mask M bearing a pattern. In the embodiment, the light source LS is an excimer laser emitting primary radiation having a nominal operation wavelength in the deep ultraviolet (DUV) spectral range, for example 193 nm. Primary radiation exciting the light source LS forms a coherent radiation bundle having a small cross-section and low divergence, which corresponds to a small value of geometrical optical flux (etendue).

A number of optical elements following the light source LS form a variable pupil shaping unit PSU configured to generate a defined spatial intensity distribution corresponding to a selected illumination mode in a pupil surface $P_{ILL}$ of the illumination system. A partial system PS following the pupil surface $P_{ILL}$ includes a number of optical elements configured to transform the two-dimensional intensity distribution present in the pupil surface $P_{ILL}$ into a corresponding angular distribution of illumination radiation incident on the mask M. The partial system PS includes elements to homogenize the radiation and to sharply define the edges of an illumination field in the exit surface EX of the illumination system, which coincides with the object surface of a subsequent projection objective (see FIG. 3).

The pupil shaping unit PSU comprises, at an entry side thereof, a beam expansion unit EXP which expands the coherent radiation bundle reveived from the light source LS. The beam expansion unit includes a number of refractive optical elements diverting the radiation such that the cross-section of the bundle is increased without altering the geometrical optical flux of the bundle.

After passing through the beam expansion unit EXP the projection radiation bundle impinges on a first optical raster element RE1 structured to increase divergence of the radiation bundle by introducing propagation angles according to a desired illumination mode. In FIG. 8 this is schematically illustrated for an axial ray that is split into two diverging rays R1, R2 after the raster element RE1. The first raster element RE1 modifies the angular distribution of the radiation bundle and also increases the geometrical optical flux thereof.

The first raster element RE1 may be formed by a diffractive optical element (DOE) or by a refractive optical element (ROE), for example. Various kinds of optical raster elements are possible, for example a micro-lens array in which micro-lenses are formed by Fresnel zone plates. The first raster element RE1 may be a reflective raster element including an array of mirror segments oriented at different angles (multi-mirror array).

First raster element RE1 is arranged in a front focal plane FFP of a zoom/axicon module ZA which includes a zoom lens group Z providing a continuously variable magnification, and an axicon group AX comprising a pair of axicons AX1, AX2, one concave and one convex, whose separation can be varied continuously to allow adjusting a distance between the axicon surfaces between zero distance (contact between axicon surfaces) and preselected finite values.

The entire zoom/axicon module ZA is configured as a focal length optical system transforming an angular distribution of radiation in the front focal plane FFP into a desired two-dimensional (spatial) intensity distribution in the rear focal plane RFP, which coincides with the pupil surface $P_{ILL}$ of the illumination system.

A field defining arrangement FD is positioned in the rear focal plane RFP of the zoom/axicon module ZA. The field defining arrangement is configured to further introduce divergence into the radiation beam, thereby further enlarging the geometrical flux of the radiation beam. The divergence introduced by the field defining arrangement FD is schematically represented by divergent rays downstream of the field defining arrangement. Embodiments of field defining arrangements suitable for this purpose are disclosed, for example, in applicant's international application published as WO 2005/078522 A2, which is incorporated herein by reference in its entirety.

The diverging rays exiting the field defining arrangement FD enter an objective OB represented by a single condenser lens. The objective OB is arranged within the illumination systems such that an entrance pupil plane of the objective OB coincides with the exit pupil surface of the zoom/axicon module. The image plane of objective OB, which is a Fourier transform plane to the pupil $P_{ILL}$ of the illumination system, is a field plane FP within the illumination system. A reticle masking unit REMA acting as an adjustable field stop is positioned in the field plane FP to define the edges of the illumination field. Details of embodiments may be taken, for example from WO 2005/078522 A2. An imaging objective RO is arranged between the field plane FP and the exit surface ES of the illumination system, where the mask M may be positioned and allows to image the intensity distribution present in the field plane FP onto the mask pattern.

FIG. 9 shows schematically a detail of a first raster element RE1 configured to generate a substantially dipolar intensity distribution having two illumination poles each having the diamond shape discussed in context of FIG. 7. The raster element RE1 is formed by an array of raster segments RS arranged side by side in a mosaic arrangement to cover without interspaces the complete illuminated surface of the raster element RE1. Such arrangement allows to generate the dipolar intensity distribution essentially without blocking any parts of the beam so that there is no intensity loss involved in the generation of the dipolar intensity distribution.

The raster element RE1 can be formed by an array of refractive lens segments. Each raster segment RS may be formed by a segment of a lens or a prism where an entry-side surface and an exit-side surface of the raster segment are oriented such that a desired redirection of radiation is caused by refraction at the segment surfaces as the radiation passes through the raster segment.

Figure 9A:
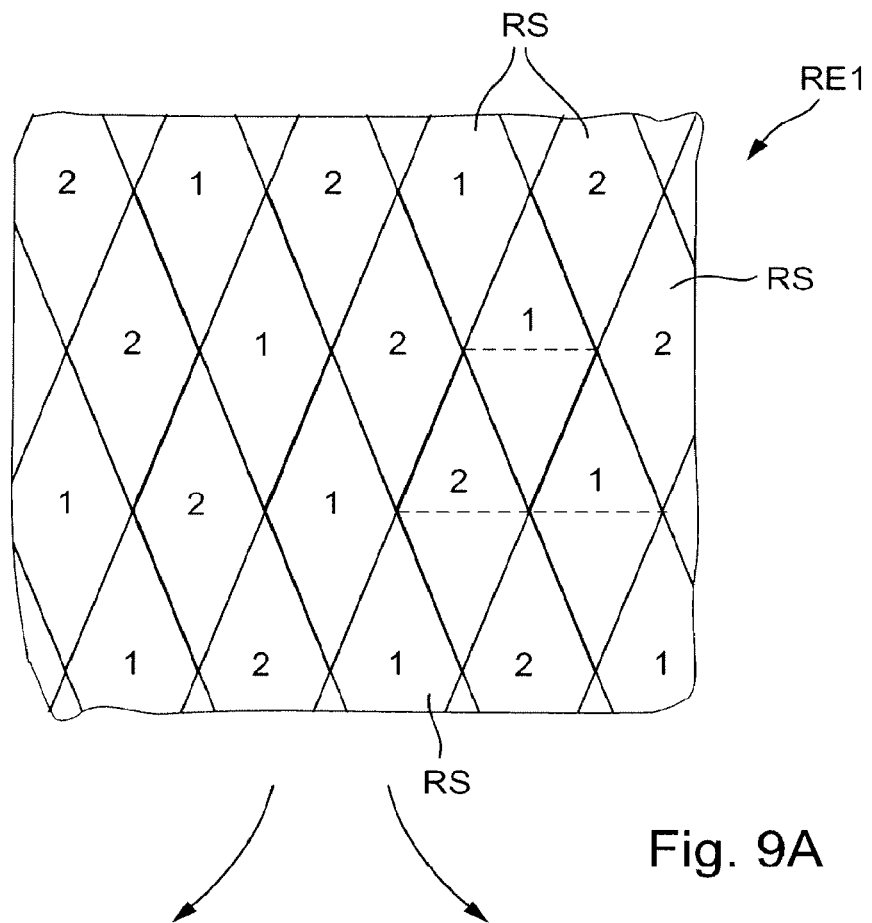
FIG. 9 shows schematically a detail of a first raster element configured to generate a substantially dipolar intensity distribution having two illumination poles each having a diamond shape as shown in FIG. 7.
Figure 9B:
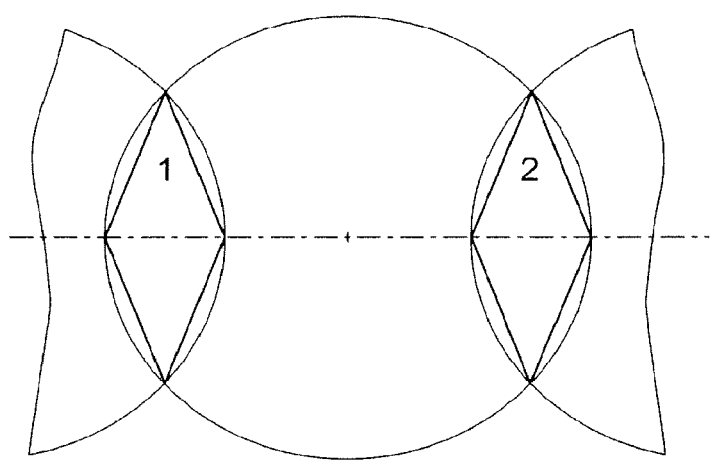

The rhombohedral shape of the raster segments RS determines the shape of the poles in the pupil surface $P_{ILL}$. In FIG. 9A the raster segments are numbered "1" and "2" to illustrate which raster segments contribute to the illumination intensity in the two poles POLE1 and POLE2 shown in FIG. 9B. The structure of the raster segments is adjusted to redirect at least a major portion of impinging radiation to the two poles.

As illustrated by dashed lines in some raster segments of FIG. 9A, the raster elements may also be segmented into other shapes, such as triangular raster segments, where the size and shape of the triangles are adapted to define, in combination, a rhombohedral area corresponding to the desired pole shape.

In some embodiments, the raster element RE1 may be designed as a diffractive computer generated hologram (CGH) assigning to each of the raster segments RS a diffractive structure effective to redirect light intensity present in a partial beam impinging on the raster segment into the associated pole. The raster segments may have a shape differing from the shape of the desired poles, e.g. a rectangular shape. The diffractive structure may be formed on the surface of a transparent substrate, such as a plane plate made of fused silica or calcium fluoride. The raster segments may also be formed of grooves etched into the surface to provide segments of a Fresnel lenses. The depth and width of the grooves may be in the order of micrometers, for example. Each raster segment may be in the order of millimeters in size and the entire array forming the raster element may have typical dimensions of one or a few centimeters.

The basic distribution of angles introduced by the raster element RE1 may be modified within the pupil shaping unit by setting the elements of the variable zoom lens group Z and/or the variable axicon group AX accordingly. In one configuration, the separation between the axicon elements AX1 and AX2 is set to zero (contact between axicon surfaces) such that no radial redirection of light intensity is effected by the axicon group AX. In other configurations, a defined separation may be set, which generally causes a central symmetric dilatation of the radiation intensity distribution, which may be useful in some cases. Adjusting the magnification of the zoom lens group Z allows to adapt the illumination intensity distribution in the pupil surface $P_{ILL}$ of the illumination system to different NA values in a homomorphous imaging step.

It is to be noted that the conditions for the pole area $A_{POLE}$, pole height PH and pole width PW as defined above remain unchanged as long as $P*NA=2*k_1*\lambda=\text{const}$. Therefore, the area of the poles as well as the pole height and pole width may be considered as a function of parameter $k_1$ alone, where $k_1 < 1$ is a process dependent parameter that incorporates everything in a lithography process that is not wavelength or numerical aperture. Generally, any process or system modification that allows improvements in resolution effectively reduces the $k_1$ factor. Diffraction-limited values are 0.25 for incoherent and 0.5 for coherent illumination, for example. Where $k_1$ stays essentially constant, sub-patterns with different predominant periodicity values P (pitches) may be illuminated using one and the same raster element RE1 by simply adjusting the appropriate NA value using the zoom lens group Z. With other words: one type of raster element with fixed configuration, such as a diffractive optical element, may be sufficient for different processes defined by one particular $k_1$ value (or a small variation of $k_1$).

Different values for $A_{POLE}$, PW and/or PH and different pole patterns may also be obtained by providing several different, interchangeable first raster elements. An automatic changer may be used to exchange raster elements of different configuration in the illumination system.

In general, the pupil-shaping unit may include at least one optical modulation device configured to controllably change an angular distribution of radiation incident on the optical modulation device such that a desired intensity distribution is obtained in the pupil surface of the illumination system.

Although the optical modulation device may have a fixed configuration to obtain only one type of intensity distribution (which may be changeable by additional variable optical elements), it is possible that the optical modulation device has an array of individual elements configured to be driven individually to change the angular distribution of radiation incident on the individual elements. The optical modulation device may include a controllable micro-mirror array, for example. Various optical modulation devices which may be used when modified for that purpose are disclosed in applicant's international patent application published as WO 2005/026843 A2. The disclosure of this application is incorporated herein by reference.

FIG. 10 shows diagrams illustrating, for an exemplary projection exposure systems, improvements that may be obtained if an optimized dipole setting is used instead of a conventional setting. In the diagrams, pupil coordinates in terms of image-side numerical aperture NA are drawn in the abscissa. The ordinates show values for the phase error value of the overall wavefront aberration. The value "0" corresponding to the optical axis. Each diagram shows an "x-cut" parallel to the x-axis (second direction) and an "y-cut" perpendicular thereto in the first direction. An x-dipole (orientation of pole orientation axis along x-direction) is used for all experiments.

Figure 10A:
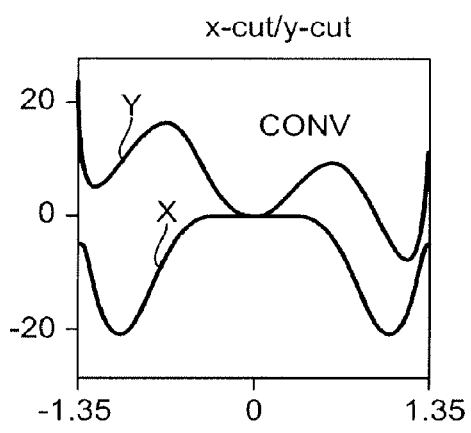
FIG. 10 shows diagrams illustrating improvements on lens heating induced wavefront phase errors obtained by illuminating with large poles.

A dipole setting having poles with the shape of a segment of an annulus (compare e.g. FIG. 2B) was used for the reference example of a conventional dipole setting CONV shown in FIG. 10A. An x-dipole setting with lenticular poles with $A_{POLE} = A_{OPT}$ was used for the experiment illustrated in FIG. 10B.

The x-cut in both experiments illustrates that the localized heating in the region of the poles generally aligned along the x-direction leads to relatively strong wavefront aberrations close to the outer edge of the pupil where the energetic centriods of the poles are positioned. In contrast, essentially no wavefront aberration is caused on and close to the optical axis in the center of the pupil. In the y-direction a relatively large variation of wavefront aberrations occurs superimposed onto a slight gradient from the upper edge to the lower edge of the pupil in this specific type of projection objective used for the experiment.

Figure 10B:
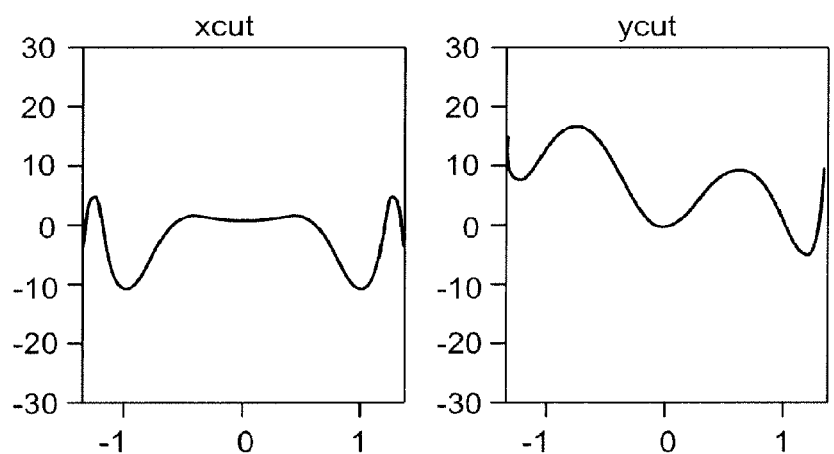

The general characteristics of the local distribution of wavefront aberrations caused by lens heating are quite similar in the experiment according to FIG. 10B. Note, however, that the absolute amount of wavefront aberration caused by lens heating is reduced by about a factor two, i.e. reduced to about 50% of the value for the conventional setting in the x-direction (different scales in the ordinates in FIG. 10A, in FIG. 10B). This significant improvement is attributed to the fact that radiant energy present within the projection beam is distributed over larger areas at the position of the poles, whereby the energy distribution in smeared out over a larger area, thereby reducing associated lens heating effects on wavefront aberrations. The effect is less pronounced in the y-direction.

In some embodiments, the multipolar illumination is a pure dipole illumination, where the intensity distribution in the pupil surface of the illumination system is formed by one substantially dipolar intensity distribution having exactly two illumination poles. Such dipole illumination may be used, for example, to print periodic patterns with features essentially aligned in one direction only. As a practical example, a layer of a highly integrated flash memory device may be strongly dominated by lines running in direction only.

Due to the relatively large pole height PH of the optimized pole areas those dipole illuminations are also useful to improve contrast of sub-patterns not running at the predominant direction, but at an angle thereto since the dipolar intensity distribution includes illumination directions significantly deviating from the direction defined by the pole orientation axis.

Figure 11:
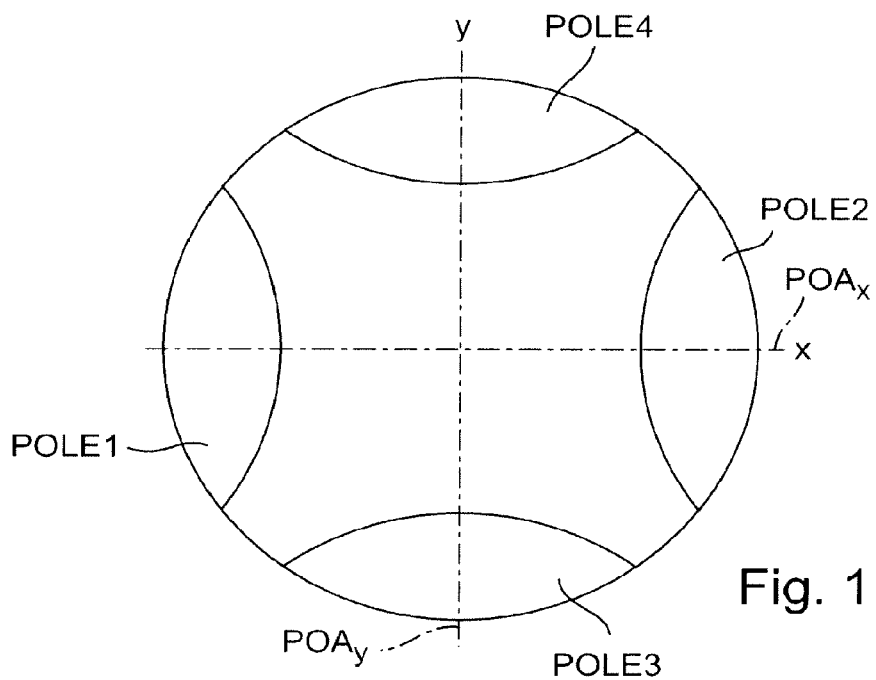
FIG. 11 shows dipole illumination with lenticular poles used for double patterning.

The multipolar illumination mode may include two substantially dipolar intensity distributions ("dipoles") superimposed on each other, where the pole orientation axes of the dipoles are rotated relatively to each other, for example by 90°. FIG. 11 depicts schematically the intensity distribution in the illumination pupil for a quadrupole illumination having two pairs of lenticular poles relatively rotated by 90° around the optical axis to form four lenticular poles, POLE1, POLE2, POLE3, POLE4, where the pole orientation axis $POA_x$ of the first dipolar intensity distribution (forming poles POLE1 and POLE2) is oriented along the x-direction, whereas the pole orientation axis $POA_y$ of the second dipolar intensity distribution (forming poles POLE3 and POLE4) is oriented perpendicular thereto in the y-direction. A bi-directional pattern having periodic features in x- and y-direction may be printed with high contrast for both directions. The area of each of the poles corresponds approximately to the optimum area $A_{OPT}$ in this example.

Figure 12:
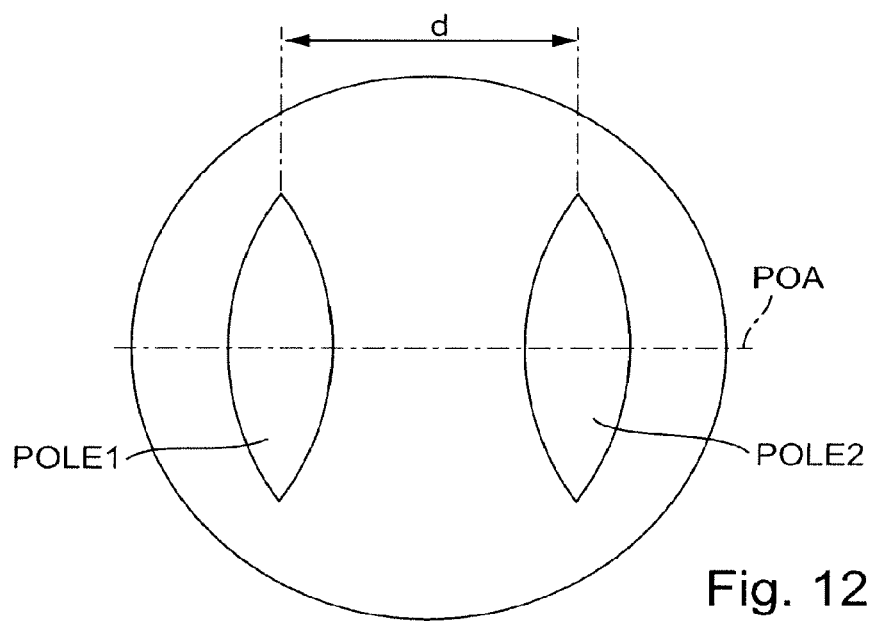
FIG. 12 shows illumination.

As illustrated schematically in FIG. 12, the method and apparatus may also be used in exposure processes which do not exploit the full resolution potential of the projection exposure apparatus. For example, a multi-polar illumination mode may be set for a pattern or sub-pattern having features spaced apart periodically at a predominant periodicity length P where the condition $0.7*\lambda/NA < P < \lambda/NA$ holds. Those conditions are sometimes used in processes known as "double patterning" where a final structure with very fine pitch is formed by subsequent exposures of coarser pattern relatively shifted to each other by one half of the periodicity length. The corresponding illumination mode may be characterized by two poles POLE1, POLE2 positioned between the edge of the pupil (corresponding to full NA) and the optical axis and defining a distance $d < \lambda/(P*NA)$. The poles may have a lenticular or a biconvex polygonal shape, for example.

The disclosure has been given by way of example. From this information, those skilled in the art will not only understand the disclosure and its attendant advantages, but will also find apparent various changes and modifications to the structures and methods disclosed. The applicant seeks, therefore, to cover all such changes and modifications as fall within the spirit and scope of defined by the appended claims, and equivalents thereof.

The contents of the claims are incorporated by reference into the description.

What is claimed is:
1. A method, comprising:
providing multipolar illumination in a pupil surface of an illumination system; and
using the multipolar illumination to image a first sub-pattern of a pattern onto a layer of a radiation-sensitive material of a substrate, the first sub-pattern including a plurality of first features extending in a first direction and spaced apart essentially periodically at a predominant periodicity length P in a second direction perpendicular to the first direction, and the multipolar illumination comprising at least one substantially dipolar intensity distribution having two illumination poles positioned on a pole orientation axis substantially parallel to the second direction and spaced apart from each other, wherein the poles of the dipolar intensity distribution each have an azimuthal width defined by a pole angle θ, and a pole area $A_{POLE}$ according to:

$$0.6 < A_{POLE}/A_{OPT} < 1.1$$

where $A_{OPT} = \theta - \sin(\theta)$ and where $\cos(\theta/2) = \lambda/(2*P*NA)$, λ is a nominal operation wavelength of radiation used, and NA is an image-side numerical aperture of a projection optical system used, and
the poles of the dipolar intensity distribution have a generally biconvex pole shape defined by a convex polygon having four or more sides, and some of the sides include angles are significantly larger than 90°.

2. The method according to claim 1, wherein:
the generally biconvex pole shape has a pole dimension ratio PDR=PH/PW>1 between a pole height PH and a pole width PW;
the pole width PW is measured between an inner pole edge and an outer pole edge in a direction parallel to the pole orientation axis; and
the pole height PH is measured between an inner pole edge and an outer pole edge in a direction perpendicular to the pole orientation axis.

3. The method according to claim 1, wherein the poles of the dipolar intensity distribution have a parallelogram pole shape defined by a non-rectangular parallelogram having a shorter diagonal and a longer diagonal, and the shorter diagonal extends substantially parallel to a line parallel to the pole orientation axis.

4. The method according to claim 1, wherein the poles of the dipolar intensity distribution each have a pole dimension ratio PDR=PH/PW between a pole height PH and a pole width PW according to $$PDR_{OPT}-20\% \leq PDR \leq PDR_{OPT}+20\%$$

where:
$PDR_{OPT} = \sin(\alpha)/(1-\cos(\alpha))$,
$\alpha = 0.5*\theta$,
the pole width PW is measured between an inner pole edge and an outer pole edge in a direction parallel to the pole orientation axis, and
the pole height PH is measured between an inner pole edge and an outer pole edge in a direction perpendicular to the pole orientation axis.

5. The method according to claim 1, wherein the predefined intensity distribution is a dipole illumination having exactly two poles.

6. The method according to claim 1, wherein the multipolar illumination includes two substantially dipolar intensity distributions superimposed on each other, and pole orientation axes of the dipolar intensity distributions are rotated relatively to each other to form a multipolar intensity distributions having exactly four poles.

7. An illumination system, comprising:
a plurality of optical elements constructed and arranged to receive primary radiation emitted from a light source and to generate illumination radiation incident on a mask bearing a pattern,
wherein:
some of the plurality of optical elements form a pupil shaping unit configured so that, during use, the plurality of optical elements generate multipolar illumination in a pupil surface of the illumination system;
the multipolar illumination includes at least one substantially dipolar intensity distribution having two illumination poles positioned on a pole orientation axis and spaced apart from each other; and
the poles of the dipolar intensity distribution each have a generally biconvex pole shape defined by a convex polygon having four or more sides, some of the sides including angles larger than 90°.

8. The illumination system according to claim 7, wherein the pupil-shaping unit comprises at least one optical raster element comprising an array of raster segments configured and arranged to generate the multipolar intensity distribution during use.

9. The illumination system according to claim 8, wherein the raster segments are arranged side by side to cover substantially without interspaces a complete illuminated surface of the raster element such that during use the multipolar intensity distribution is generated essentially without intensity loss.

10. The illumination system according to claim 8, wherein the raster segments comprise diffractive elements such that the raster element is a diffractive optical element.

11. The illumination system according to claim 10, wherein the diffractive optical element comprises a computer generated hologram.

12. The illumination system according to claim 8, wherein the raster segments comprise refractive elements such that the raster element is a refractive optical element.

13. The illumination system according to claim 8, wherein the raster element is a reflective raster element and the raster segments comprise individual mirror segments to form a multi-mirror array.

14. The illumination system according to claim 13, wherein individual mirror segments are configured to be controlled individually in order to change an angular distribution of radiation reflected by the mirror segments.

15. The illumination system according to claim 8, further comprising an automatic changer configured to exchange raster elements of different configuration in the illumination system.

16. The illumination system according to claim 7, wherein during use:
the optical elements that form the pupil shaping unit are configured to generate a basic intensity distribution including areas of the poles of the dipolar intensity distribution and extending beyond the areas of the poles;
the illumination system further comprises a blocking device arranged at or close to the pupil surface of the illumination system where the basic intensity distribution is generated, or at or close to a pupil surface optically conjugate thereto; and
the blocking device is designed to block areas of the basic intensity distribution which lie outside the region desired for the pole shape.

17. The illumination system according to claim 7, wherein the pupil shaping unit comprises a zoom lens group configured to provide a continuously variable magnification during use.

18. The illumination system according to claim 17, wherein the zoom lens group is arranged between an optical raster element and the pupil surface of the illumination system.

19. The illumination system according to claim 7, wherein:
the pupil shaping unit comprises an axicon group comprising a pair of axicon elements having axicon surfaces, one concave and one convex, wherein at least one of the axicon elements is movable along an optical axis of the illumination system to allow adjusting a distance between the axicon surfaces.

20. The illumination system according to claim 19, wherein the axicon group is arranged between an optical raster element and the pupil surface of the illumination system.

21. The illumination system of claim 7, wherein the poles of the dipolar intensity distribution each have an azimuthal width defined by a pole angle $\theta$, and a pole area $A_{POLE}$ according to:

$$0.6 < A_{POLE}/A_{OPT} < 1.1$$

where $A_{OPT} = \theta - \sin(\theta)$ and where $\cos(\theta/2) = \lambda/(2*P*NA)$, $\lambda$ is a nominal operation wavelength of radiation used, and NA is an image-side numerical aperture of a projection optical system used.

22. The illumination system according to claim 21, wherein the poles of the dipolar intensity distribution each have a pole dimension ratio PDR=PH/PW between a pole height PH and a pole width PW according to $$PDR_{OPT} - 20\% \leq PDR \leq PDR_{OPT} + 20\%$$

where:
$PDR_{OPT} = \sin(\alpha)/(1-\cos(\alpha))$,
$\alpha = 0.5*\theta$,
the pole width PW is measured between an inner pole edge and an outer pole edge in a direction parallel to the pole orientation axis, and
the pole height is measured between pole edges in a direction perpendicular to the pole orientation axis.

23. An apparatus, comprising:
an illumination system configured so that during use the illumination system guides radiation along an illumination path to generate illumination radiation incident on a mask bearing a pattern; and
a projection objective configured so that during use the projection objective projects an image of the pattern onto a radiation-sensitive substrate with projection radiation guided along a projection path,
wherein:
the apparatus is a projection exposure apparatus,
some of a plurality of optical elements form a pupil shaping unit configured so that, during use, the plurality of optical elements generate multipolar illumination in a pupil surface of the illumination system;
the multipolar illumination includes at least one substantially dipolar intensity distribution having two illumination poles positioned on a pole orientation axis and spaced apart from each other; and
the poles of the dipolar intensity distribution each have a generally biconvex pole shape defined by a convex polygon having four or more sides, some of the sides including angles larger than 90°.

24. An apparatus, comprising:
an illumination system configured so that during use the illumination system guides radiation along an illumination path to generate illumination radiation incident on a mask bearing a pattern, the pattern comprising a first sub-pattern including a plurality of first features extending in a first direction and spaced apart essentially periodically at a predominant periodicity length P in a second direction perpendicular to the first direction; and
a projection objective having an image-side numerical aperture NA and configured to project an image of the pattern onto a radiation-sensitive substrate with projection radiation guided along a projection path during use,
wherein:
the illumination system is configured to provide during use, in a pupil plane of the illumination system, an effective source of radiation for multipolar illumination comprising at least one substantially dipolar intensity distribution having two illumination poles positioned on a pole orientation axis substantially parallel to the second direction and spaced apart from each other;
the poles of the dipolar intensity distribution in the pupil plane of the illumination system correspond to poles of a dipolar intensity distribution in a pupil surface of a projection objective; and
the poles of the dipolar intensity distribution each have an azimuthal width defined by a pole angle $\theta$, and a pole area $A_{POLE}$ according to:

$$0.6 < A_{POLE}/A_{OPT} < 1.1$$

where $A_{OPT} = \theta - \sin(\theta)$ and where $\cos(\theta/2) = \lambda/(2*P*NA)$, and $\lambda$ is a nominal wavelength of the radiation,
the poles of the dipolar intensity distribution each have a parallelogram pole shape defined by a non-rectangular parallelogram having a shorter diagonal and a longer diagonal, the shorter diagonal extending substantially parallel to a line parallel to the pole orientation axis.

* * * * *

UNITED STATES PATENT AND TRADEMARK OFFICE
CERTIFICATE OF CORRECTION

PATENT NO. : 8,917,379 B2  
APPLICATION NO. : 12/483733  
DATED : December 23, 2014  
INVENTOR(S) : Paul Graeupner Page 1 of 1

It is certified that error appears in the above-identified patent and that said Letters Patent is hereby corrected as shown below:

In the Specification

Col. 2, line 6, delete "$\theta$" and insert -- $\lambda$ --.

Col. 4, line 59, delete "polses" and insert -- poles --.

Col. 5, line 47, delete "a" and insert -- $\sigma$ --.

Col. 5, line 48, delete "a" and insert -- $\sigma$ --.

Col. 10, line 49, delete "reveived" and insert -- received --.

Col. 13, lines 37-38, delete "centriods" and insert -- centroids --.

Signed and Sealed this  
Second Day of June, 2015

Michelle K. Lee  
*Director of the United States Patent and Trademark Office*